United States Patent [19]
Scott

[11] Patent Number: 5,104,817
[45] Date of Patent: Apr. 14, 1992

[54] METHOD OF FORMING BIPOLAR TRANSISTOR WITH INTEGRAL BASE EMITTER LOAD RESISTOR

[75] Inventor: David B. Scott, Plano, Tex.

[73] Assignee: Texas Instruments Incorporated, Dallas, Tex.

[21] Appl. No.: 496,486

[22] Filed: Mar. 20, 1990

[51] Int. Cl.$^5$ .......................................... H01L 21/265
[52] U.S. Cl. ........................................ 437/31; 437/51;
437/55; 437/60; 437/186; 437/59; 148/DIG. 9;
307/446
[58] Field of Search ............... 437/31, 56, 57, 59,
437/51, 60, 55; 357/43, 59; 148/DIG. 9;
307/466

[56] References Cited

U.S. PATENT DOCUMENTS

| | | | |
|---|---|---|---|
| 4,255,671 | 3/1981 | Nonaka et al. | 407/446 |
| 4,314,267 | 2/1982 | Bergeron et al. | 307/446 |
| 4,786,961 | 11/1988 | Avery | 307/548 |
| 4,868,135 | 9/1989 | Ogura et al. | 437/56 |
| 4,954,865 | 9/1990 | Rokos | 437/31 |
| 5,001,074 | 3/1991 | Arnborg | 437/51 |
| 5,031,020 | 7/1991 | Momose | 357/43 |

FOREIGN PATENT DOCUMENTS 0162863 12/1981 Japan ........................................ 357/43

Primary Examiner—Brian E. Hearn
Assistant Examiner—Tuan Nguyen
Attorney, Agent, or Firm—Douglas A. Sorensen;
Stanton C. Braden; Richard L. Donaldson

[57] ABSTRACT

The described embodiments of the present invention provide a bipolar transistor using an integrated field effect load device with one end of the load device integrally formed with the base of the transistor. The gate of the load device is connected to the emitter of the transistor. This structure is particularly advantageous in bipolar-complementary metal oxide semiconductor (BiCMOS) integrated circuitry. The unconnected end of the load device may be connected to the emitter using standard metal interconnection techniques or local interconnection techniques. In an additional embodiment of the invention, the end of the load device not connected to the base may be left unisolated to the substrate and thus connected to ground. It often occurs that the emitter of the bipolar transistor will be connected to ground and thus an automatic connection of the load device between the base and the emitter can be realized. In addition, by removing the isolation, the integrated circuit area required for the isolation may be saved.

6 Claims, 23 Drawing Sheets

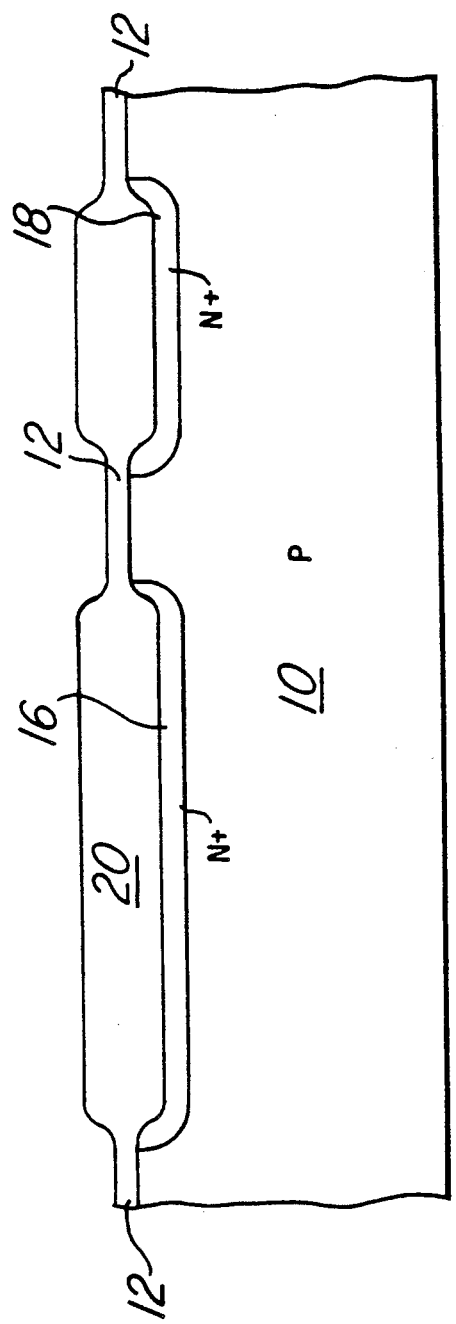

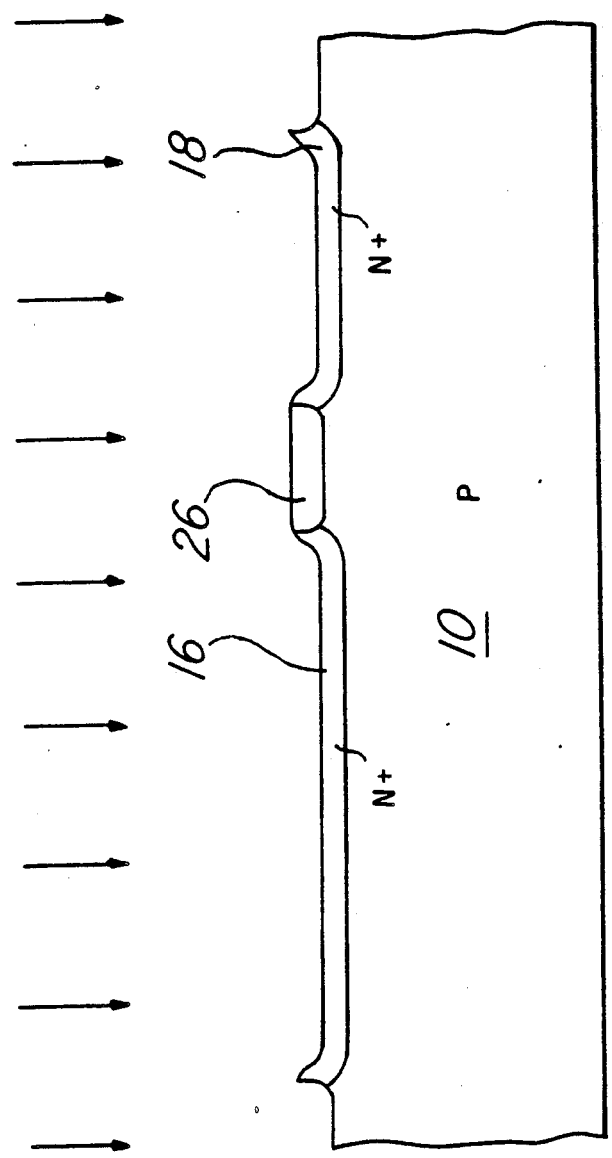

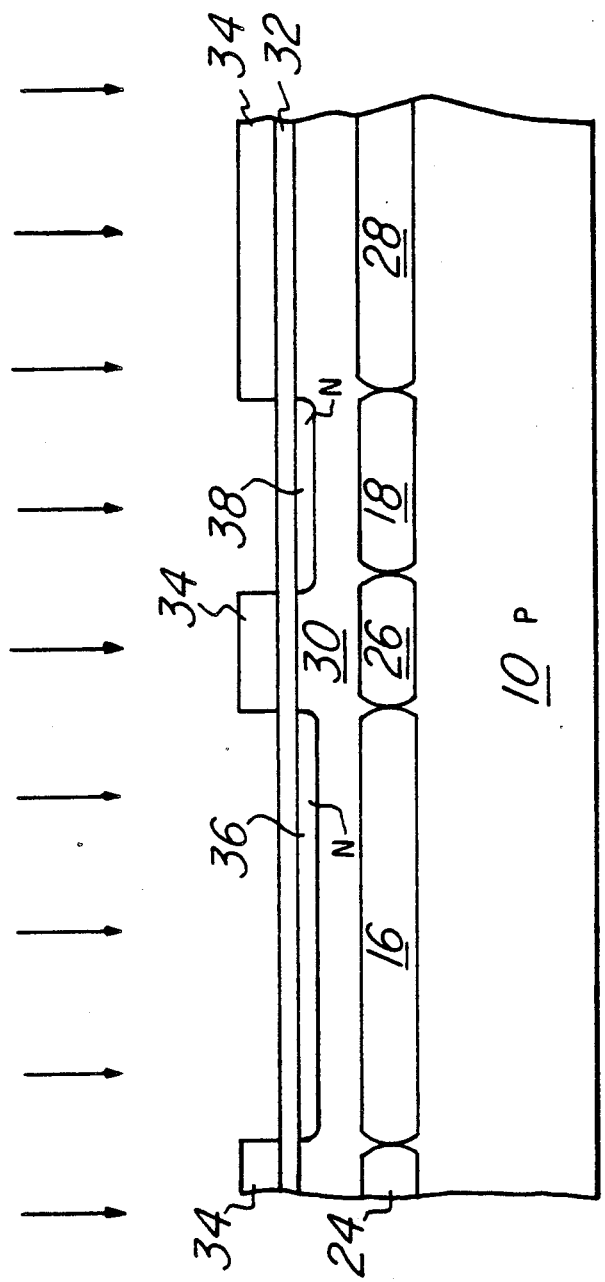

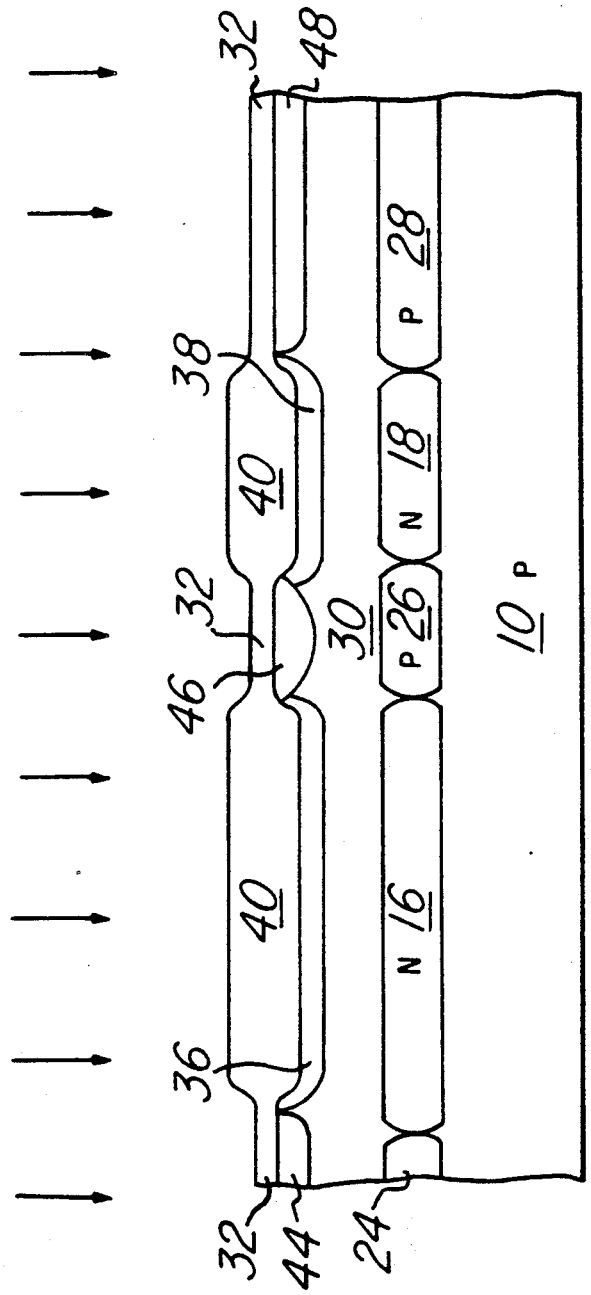

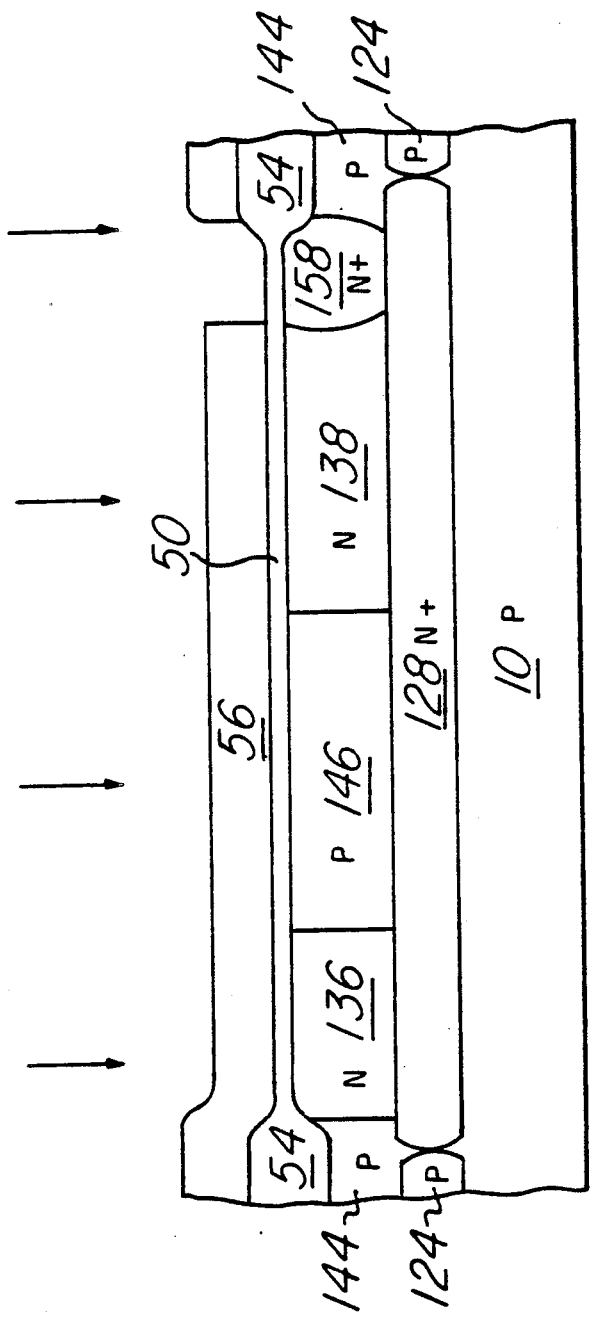

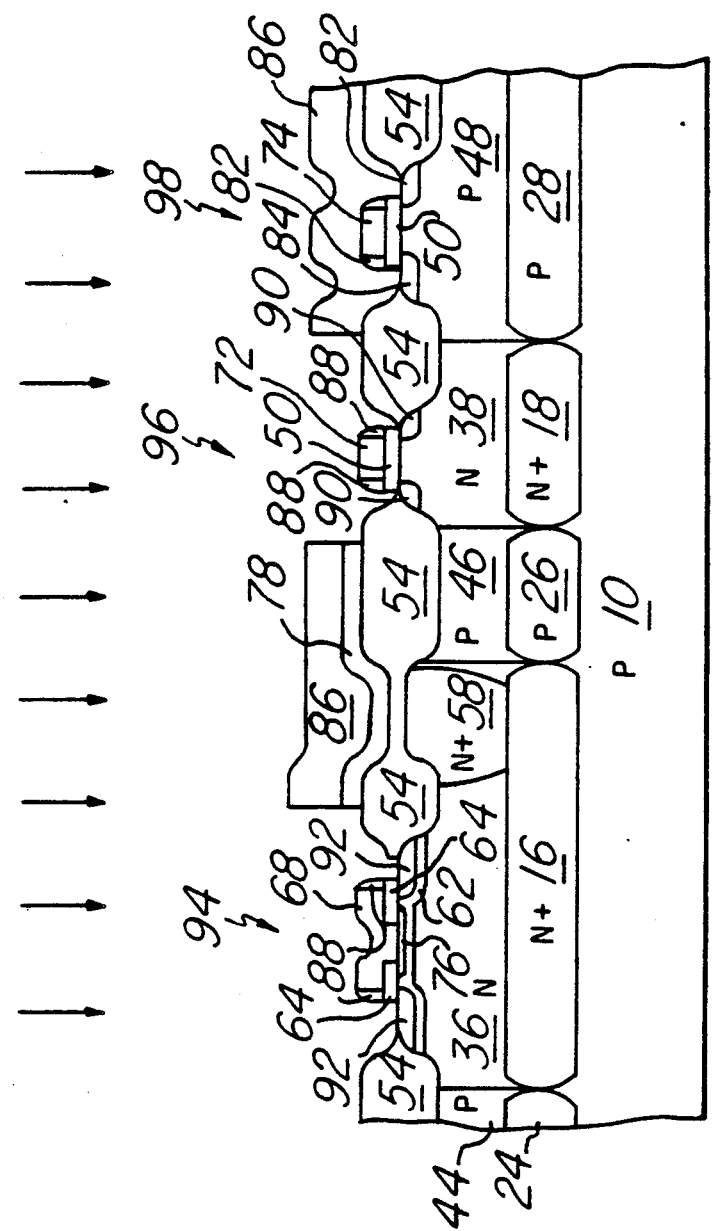

METHOD OF FORMING BIPOLAR TRANSISTOR WITH INTEGRAL BASE EMITTER LOAD RESISTOR

FIELD OF THE INVENTION

The present invention relates to the field of integrated circuit devices. More specifically, the present invention relates to structures for providing resistive loads with bipolar circuitry.

BACKGROUND OF THE INVENTION

It is a well-known technique in the art of bipolar circuitry to use a resistor with one terminal connected to the base of a bipolar transistor and the other terminal connected to the emitter of the bipolar transistor to provide higher speed operation of the transistor, particularly in digital applications. When a bipolar transistor is turned on (i.e., when bias current is applied to the base and a low conductivity is present between the collector and the emitter), the forward bias on the base emitter junction behaves as a capacitive load. When it is desired to turn the transistor off (i.e., to create a high conductivity state between the emitter and the collector), forward bias current to the base is removed. However, a certain amount of forward bias charge remains in the base to emitter junction until this charge is discharged. A resistor is placed between the base and emitter to allow a path for this discharge to speed the process of turning off of the transistor.

In integrated circuitry, resistors are a very difficult component to make. Simple use of resistive elements provides a structure which is much larger than transistors themselves. To this end, circuit designers have used other transistors to form resistor-like devices in integrated circuitry. However, even these structures require the addition of the whole area of an additional transistor to provide the appropriate discharging capability for the base to emitter junction.

SUMMARY OF THE INVENTION

The described embodiments of the present invention provide a bipolar transistor using an integrated field effect load device with one end of the load device integrally formed with the base of the transistor. The gate of the load device is connected to the emitter of the transistor. This structure is particularly advantageous in bipolar-complementary metal oxide semiconductor (BiCMOS) integrated circuitry. The unconnected end of the load device may be connected to the emitter using standard metal interconnection techniques or local interconnection techniques.

In an additional embodiment of the invention, the end of the load device not connected to the base may be left unisolated from the substrate and thus connected to ground. It often occurs that the emitter of the bipolar transistor will be connected to ground and thus an automatic connection of the load device between the base and the emitter can be realized. In addition, by removing the isolation, the integrated circuit area required for the isolation may be saved.

DESCRIPTION OF THE DRAWINGS

FIGS. 1A through 15A are side view schematic diagrams depicting the processing steps used in one known technique for forming BiCMOS integrated circuitry; and FIGS. 4B, 7B, 9B through 12B and 15B are side view schematic diagrams showing the fabrication of one embodiment of the present invention coordinated with the processes shown in FIGS. 1A through 15A.

DETAILED DESCRIPTION OF THE EMBODIMENTS

FIGS. 1A through 15A are side view schematic diagrams depicting processing steps known in the prior art for fabricating BiCMOS integrated circuitry. FIGS. 4B, 7B, 9B through 12B and 15B are side view schematic diagrams showing the processing steps as coordinated with corresponding figure numbers of FIGS. 1A through 15A for fabricating one embodiment of the present invention. These sets of figures are coordinated so that one figure, for example, 4B is the processing steps for fabricating one embodiment of the present invention at the same stage of fabrication using compatible processing steps with the structure shown in FIG. 4A. The figures are coordinated in this way to demonstrate the compatibility of the described embodiments of the invention with known BiCMOS processes. This is a major advantage of these embodiments. FIG. 16 is a plan view schematic diagram of the embodiment of the present invention fabricated using the steps described in FIGS. 4B, 7B, 9B through and 15B.

Figure 1A:
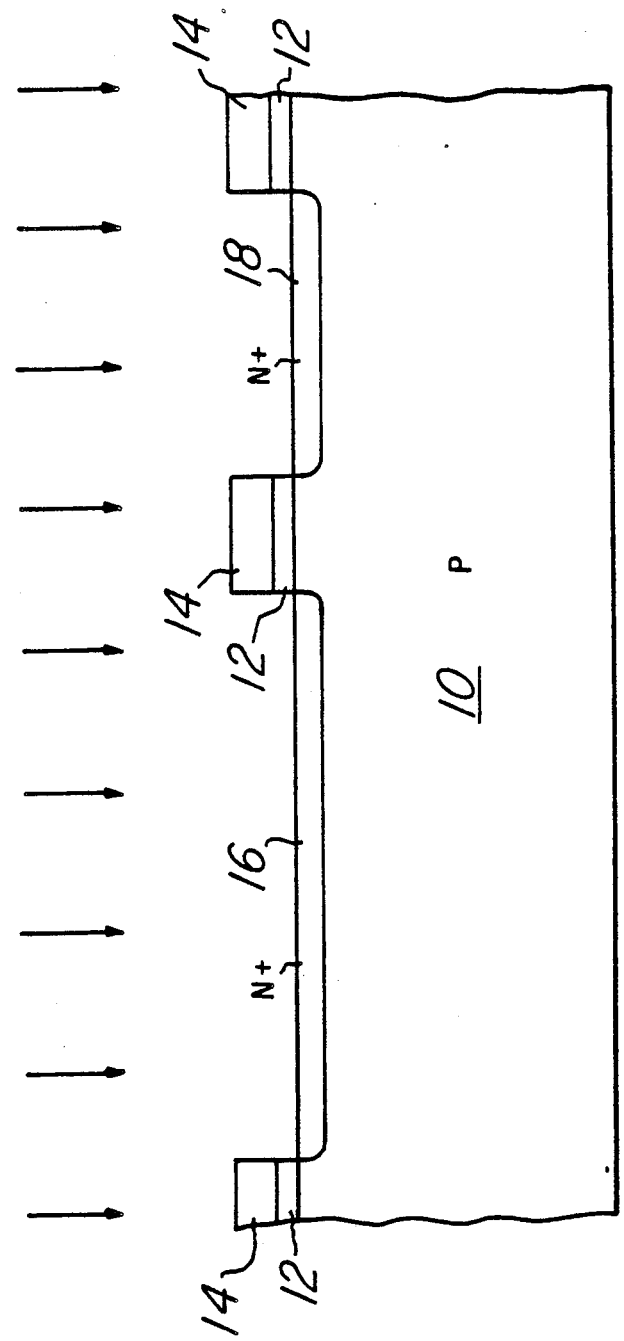

Referring to FIG. 1A, the starting material for the described fabrication processes is <100> oriented crystalline silicon doped P type to a conductivity of 10 ohms-cm. This is substrate 10 as shown in FIG. 1A. A layer of silicon dioxide 12 is formed on the surface of substrate 10 by thermal oxidation in an $O_2$ ambient at a temperature of approximately 900° C. for approximately 250 minutes. Silicon dioxide layer 12 is then patterned using common photolithographic techniques to provide the structure shown in FIG. 1A. The structure of FIG. 1A is then subjected to an ion implantation of N type ions, such as antimony ions, having an energy of approximately 40 Kiloelectron-Volts at a density of approximately $3 \times 10^{15}$ ions/cm$^2$. This ion implantation provides N type regions 16 and 18 as shown in FIG. 1A. The structure of FIG. 1A is then subjected to thermal oxidation in a $N_2/O_2$ ambient for approximately 30 minutes at a temperature of approximately 1250° C. This oxidation step provides thick oxide layer 20 as shown in FIG. 2A. Portions of silicon dioxide layer 20 are thicker than others because of the higher rate of oxidation of heavily doped silicon as opposed to lightly doped silicon. In addition, N+ doped regions 16 and 18 are driven into substrate 10 and annealed. Silicon dioxide layer 12, silicon nitride layer 14 and silicon dioxide layer 20 are then removed using standard wet etching techniques.

Figure 4A:
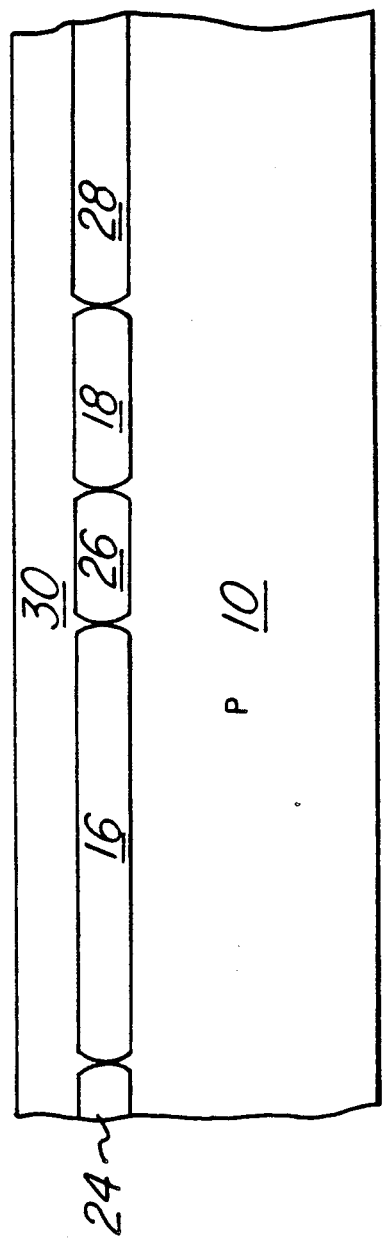
Figure 4B:
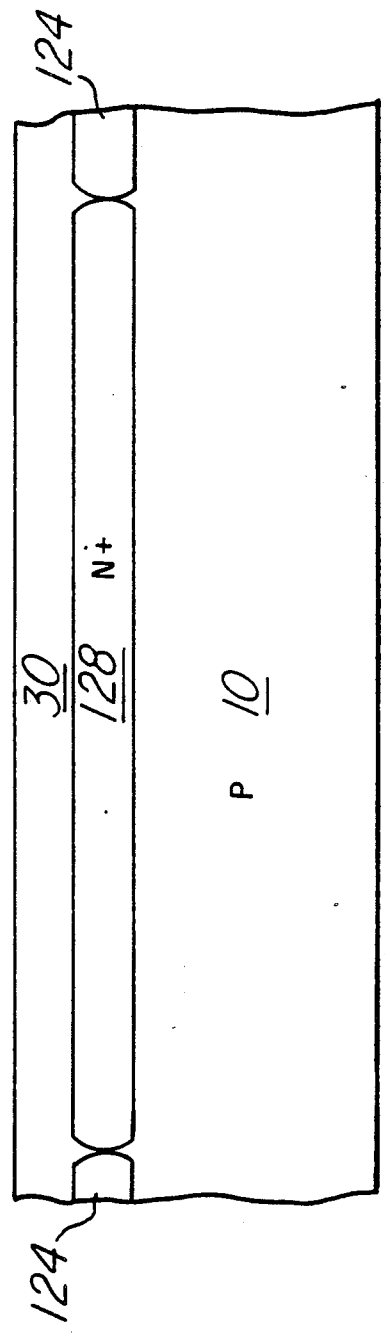

The structure of FIG. 2A is then subjected to an ion implantation of boron ions having an energy of approximately 160 Kiloelectron-Volts and a density of approximately $4 \times 10^{12}$ ions/cm$^2$. This ion implantation forms P regions 24, 26 and 28 as shown in FIG. 4A. Silicon dioxide layer 20 shown in FIG. 3A is removed using an oxide such as $HF_2$ etchant. The surface of the structure of FIG. 3A is planarized and an intrinsic silicon epitaxial layer 30 is then formed on the surface of substrate 10. The remaining structure is shown in FIG. 4A. Buried P regions 124 and buried N+ region 128 as shown in FIG.

4B are formed using the processing techniques used to form P region 24 and P region 28 in FIG. 4A.

A process for forming buried doped regions 16, 18, 24, 26, 28, 124 and 128 providing higher planarity and an improved structure may be found in copending application, Ser. No. 265,074 filed Oct. 31, 1988 and assigned to the assignee of this application. Ser. No. 265,074 is hereby incorporated by reference.

Silicon dioxide layer 32 is then formed on the surface of the structure of FIG. 4A by thermal oxidation in an $O_2$ ambient for approximately 60 minutes at a temperature of approximately 1,000° C. This structure is shown in FIG. 5A. Silicon nitride layer 34 is then formed to a thickness of approximately 1,000 Å using low pressure chemical vapor deposition. Silicon nitride layer 34 is then patterned using common photolithographic techniques to provide the structure as shown in FIG. 5A. The structure of FIG. 5A is then subjected to a double ion implantation of phosphorous ions having energies of approximately 70 Kiloelectron-Volts and 350 Kiloelectron-Volts and both having a total density of approximately $2.2 \times 10^{12}$ ions/cm$^2$. This ion implantation forms N regions 36 and 38 as shown in FIG. 5A.

Figure 7A:
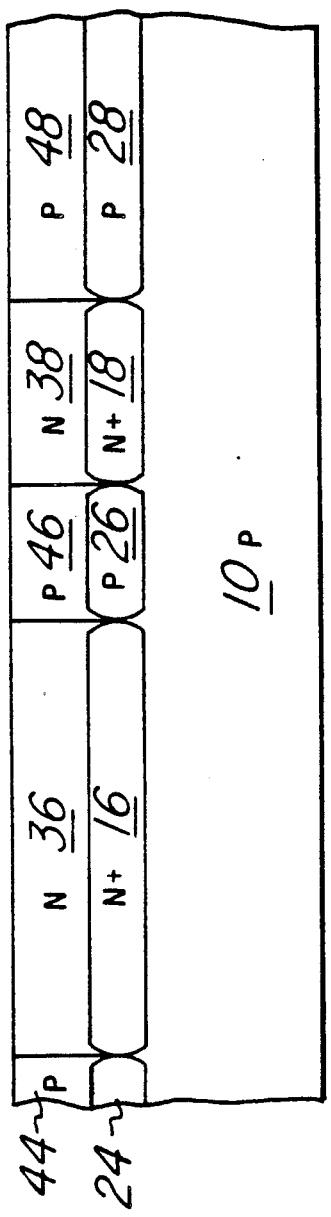
Figure 7B:
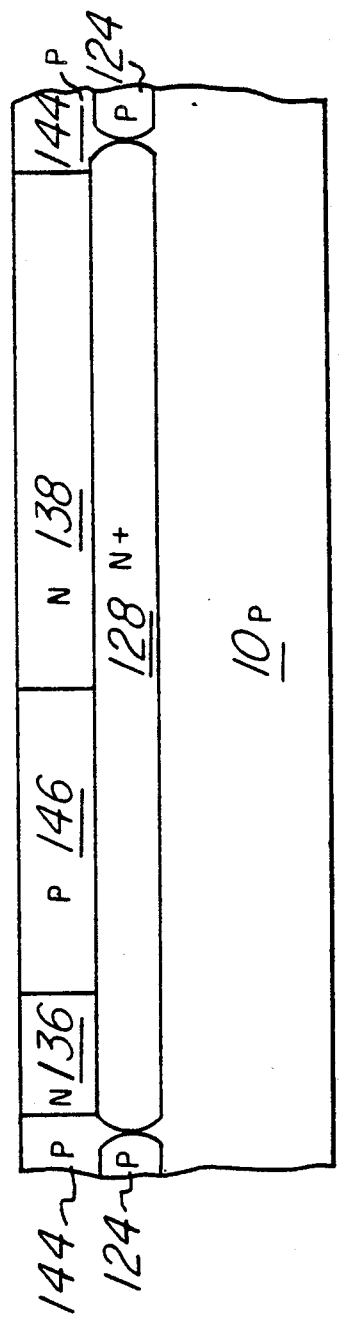

The structure of FIG. 5A is then subjected to thermal oxidation in a steam ambient for approximately 190 minutes at approximately 900° C. This forms thick oxide regions 40 and 42 as shown in FIG. 6A. The structure of FIG. 6A is then subjected to an ion implantation of boron ions having an energy of approximately 50 Kiloelectron-Volts and a density of approximately $1 \times 10^{12}$ ions/cm$^2$. This ion implantation forms P regions 44, 46 and 48 as shown in FIG. 6A. The surface of the structure of FIG. 6A is planarized and diffusions 36, 38, 44, 46, and 48 are driven in using an annealing step at a temperature of approximately 1000° C. for approximately 250 minutes in an $O_2$ ambient. The resulting structure is shown in FIG. 7A. P wells 144, 146 and N wells 136 and 138 of FIG. 7B are formed in conjunction with the steps used to form P wells 44, 46 and N wells 36 and 38 of FIG. 7B.

Figure 8A:
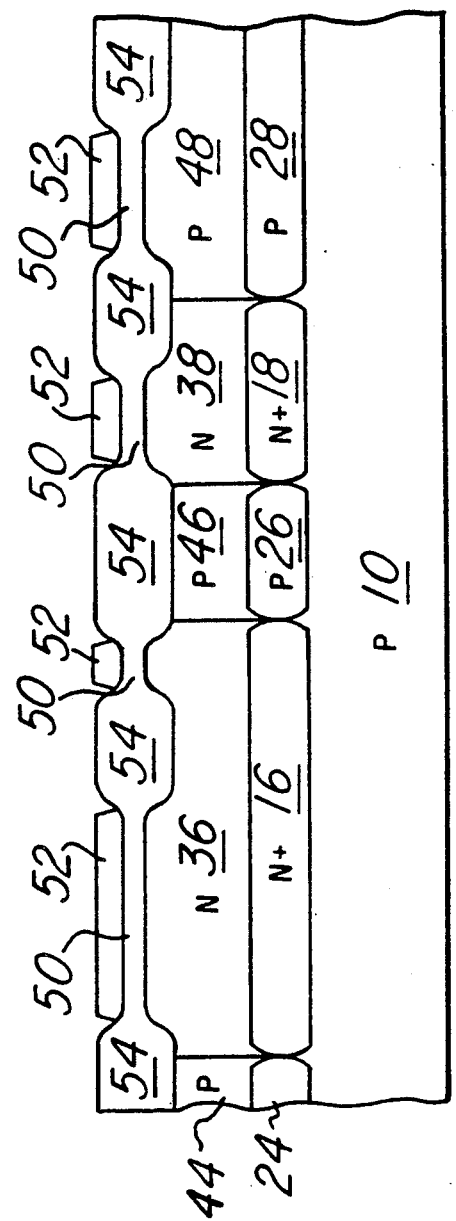

A thin silicon dioxide layer 50 is then grown on the surface of the structure of FIG. 7A using thermal oxidation in an $O_2$ ambient as shown in FIG. 8A. A layer of silicon nitride 52 is formed on the surface of silicon dioxide layer 50 and patterned to provide the structure shown in FIG. 8A. This structure is then subjected to a thermal oxidation step in an $O_2$ ambient at approximately 900° C. for approximately 500 minutes to form silicon dioxide regions 54 to a thickness of approximately 7000 Å as shown in FIG. 8A.

Figure 9A:
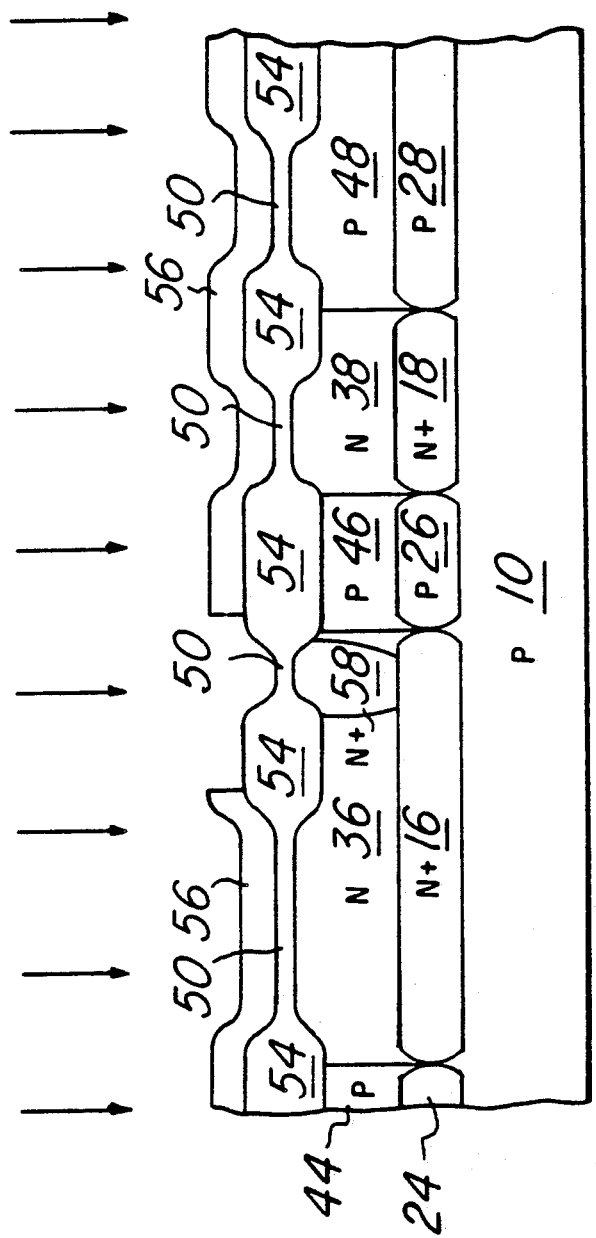

Silicon nitride layer 52 is removed using wet chemical etching in phosphoric acid. A layer of photoresist 56 is then formed on the surface of the structure of FIG. 8A as shown in FIG. 9A. Photoresist layer 56 is selected to a thickness of sufficient to provide a thick ion implantation mask for the implantation of arsenic ions at an energy of approximately 150 Kiloelectron-Volts having a density of approximately $1 \times 10^{16}$ atoms/cm$^2$. This ion implantation forms, when annealed, N+ contact region 58 as shown in FIG. 9A. Thick silicon dioxide regions 54 and thin silicon dioxide region 50 are also formed as shown in FIG. 9B in conjunction with the formation of similarly numbered features in FIG. 9A. Photoresist layer 56 is also patterned as shown in FIG. 9B. The ion implantation forms N+ region 158 as shown in FIG. 9B.

Figure 10A:
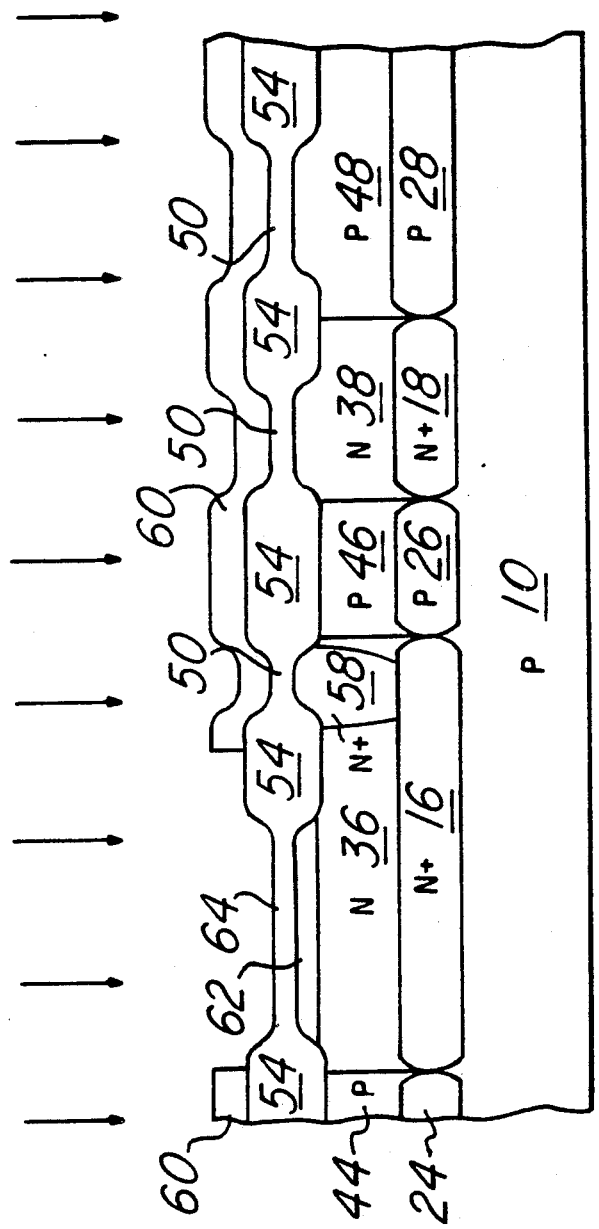
Figure 10B:
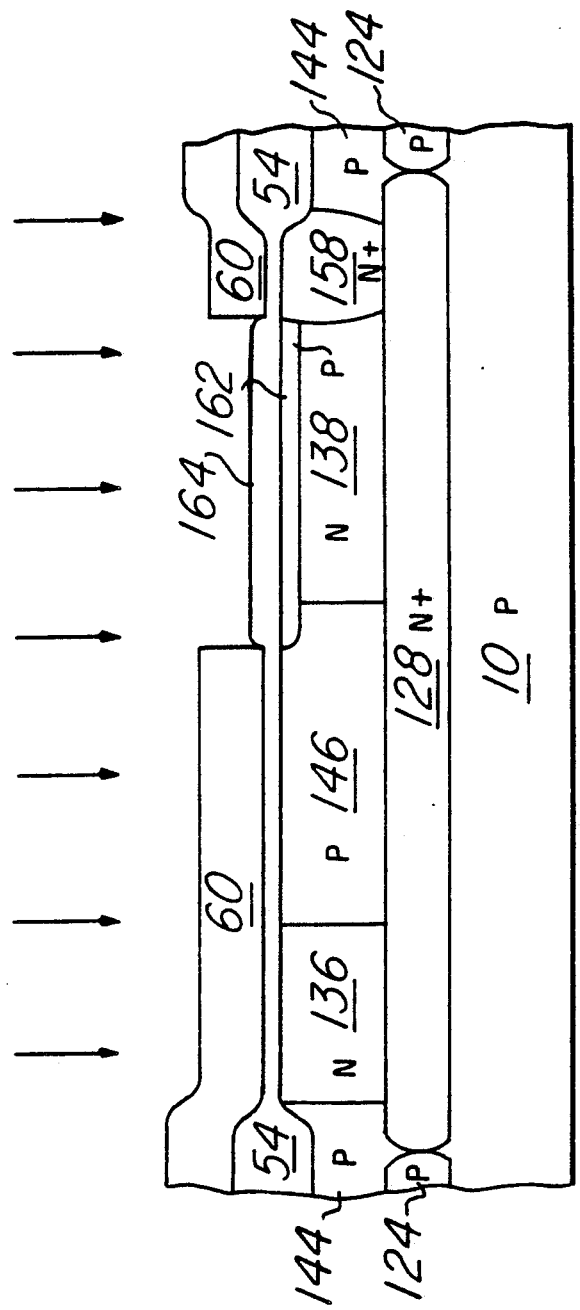

Photoresist layer 56 is then removed using common liquid removal techniques. Silicon nitride layer 60 is then formed on the surface of the structure of FIG. 9A as shown in FIG. 10A. Silicon nitride layer 60 is patterned and etched to expose the surface of silicon dioxide layer 50 above N well 36. Silicon dioxide layer 64 is then grown using thermal oxidation at a temperature of approximately 1000 degrees in an $O_2$ atmosphere for approximately 100 minutes. Silicon dioxide layer 64 is grown to a thickness of approximately 1400 Å which is much thicker than the 350 Å thickness of silicon dioxide layers 50. This is structure is subjected to an ion implantation of boron ions having a density of approximately $6 \times 10^{13}$ ions/cm$^2$ and an energy of approximately 40 Kiloelectron-Volts. This is annealed to form P region 62 as shown in FIG. 10A. Silicon nitride layer 60 is also patterned as shown in FIG. 10B and oxide layer 164 is formed using the oxidation step used to form silicon dioxide layer 64. The ion implantation step used to form P region 62 in FIG. 10A is also used to form P region 162 in FIG. 10B. The edge of P region 162 can extend into P well 146. The exact position of this edge is not critical thus saving the space required for alignment tolerances in fabricating this device.

Figure 11A:
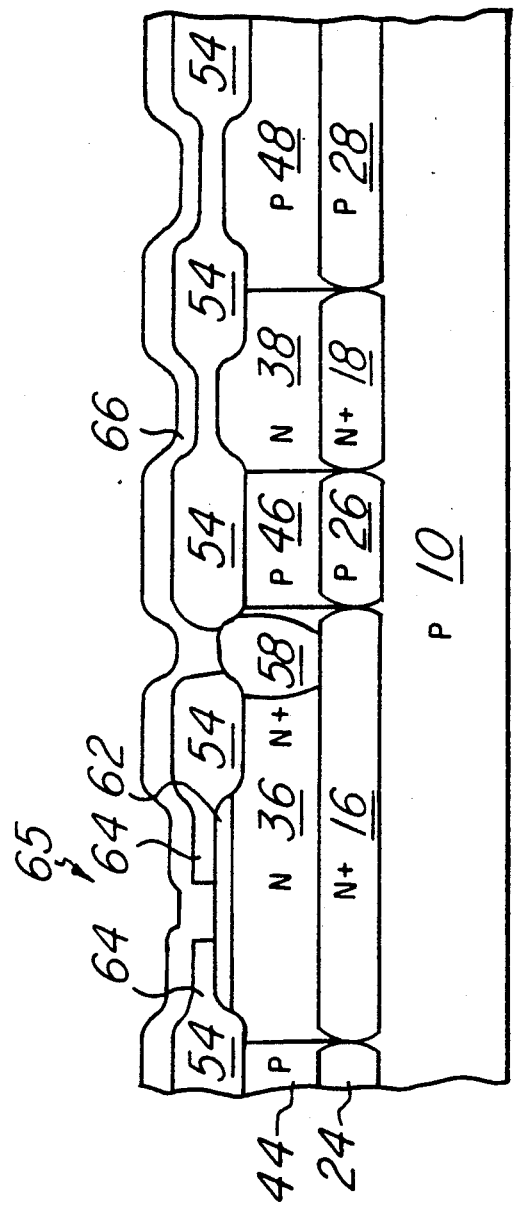
Figure 11B:
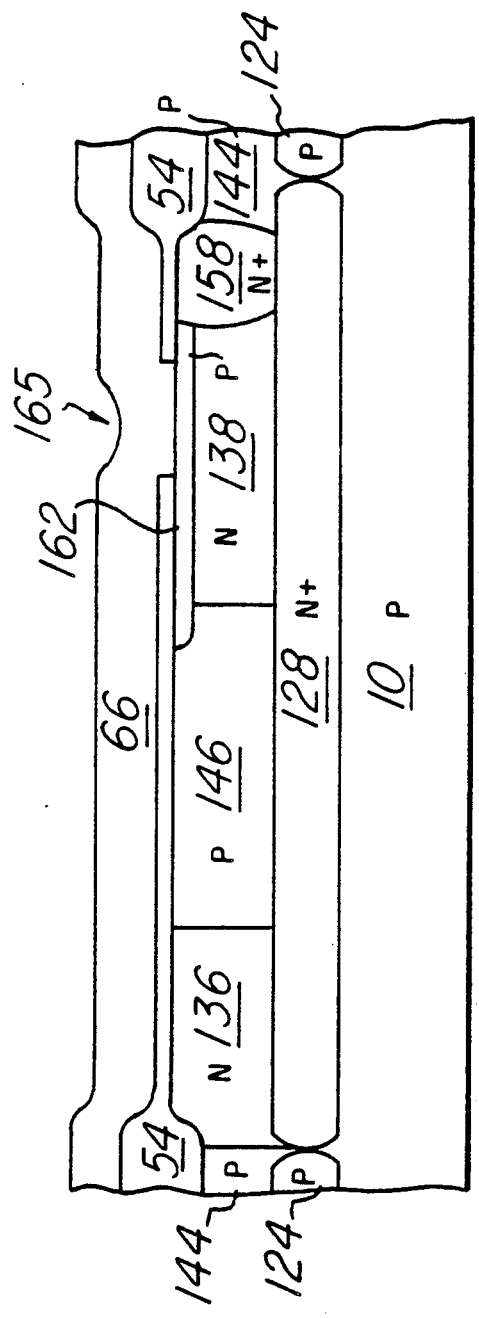

Silicon nitride layer 60 is then removed using wet chemical etching in hot phosphoric. A photomask (not shown) is then formed and patterned to expose a portion of silicon dioxide layer 64. The exposed portion of silicon dioxide layer 64 is then removed using reactive ion etching using carbon tetrafluoride. The photomask (not shown) is then removed and a layer of polycrystalline silicon 66 is formed on the surface of the structure of FIG. 11A. Polycrystalline silicon layer 66 is doped to N++ type using one of several optional techniques, such as ion implantation, in situ doping, or any other suitable technique. Opening 165 of FIG. 11B is formed as opening 65 in FIG. 11A is formed and N++ doped polysilicon layer 66 is deposited so as to be in contact with P region 162 as shown in FIG. 11B.

Figure 12A:
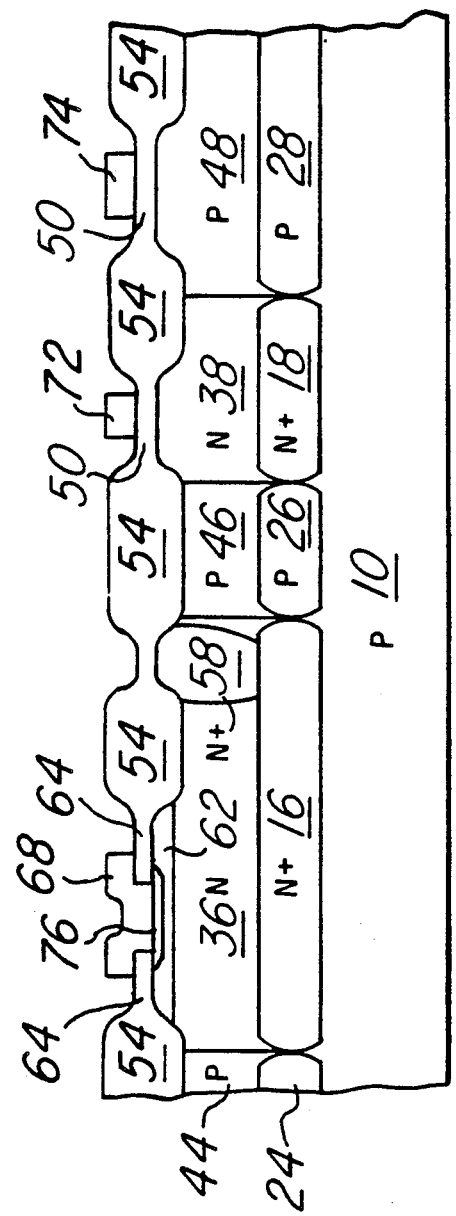
Figure 12B:
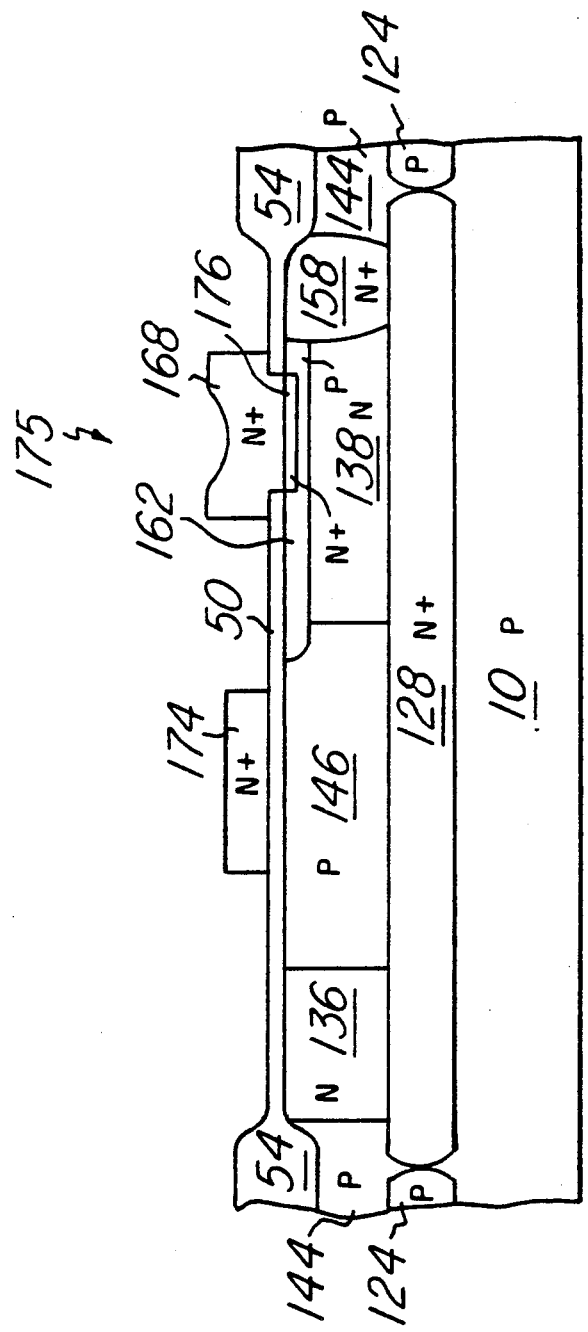

Polycrystalline silicon layer 66 is then patterned to provide base contact 68, gate 72 and gate 74 as shown in FIG. 12A. In the process, a portion of the doping from polycrystalline silicon layer 66 diffuses into the surface P region 62 to form N++ emitter 76. Polycrystalline silicon layer 66 is also patterned to provide gate 174 and emitter contact 168 as shown in FIG. 12B. Out diffusion of N+ dopant atoms from polycrystalline silicon contact 168 creates N++ emitter 176. Thus a bipolar transistor 175 has been formed with the collector being the combination of N well 138 and N+ buried region 128, the base being P region 162 and the emitter being N++ region 176.

Figure 13A:
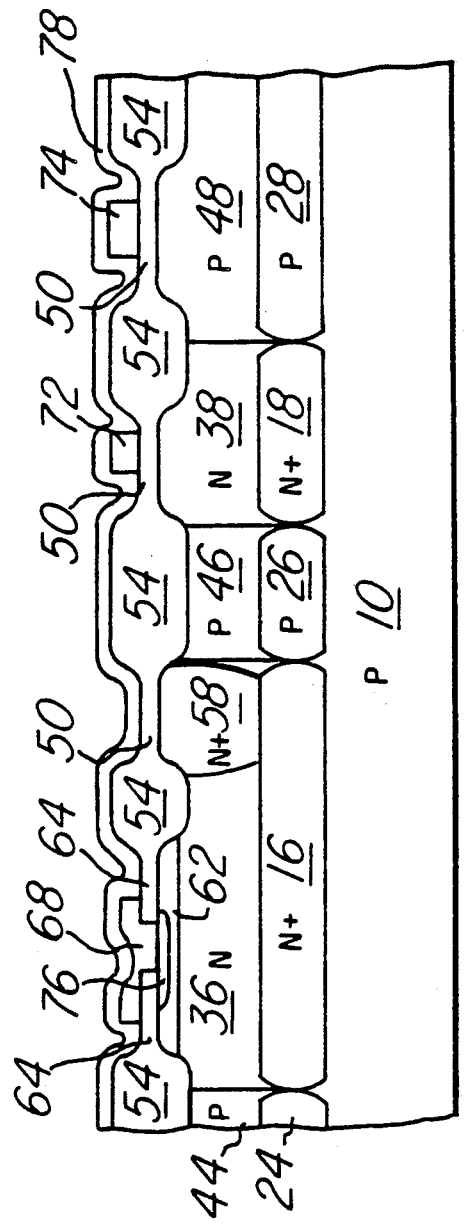
Figure 14A:
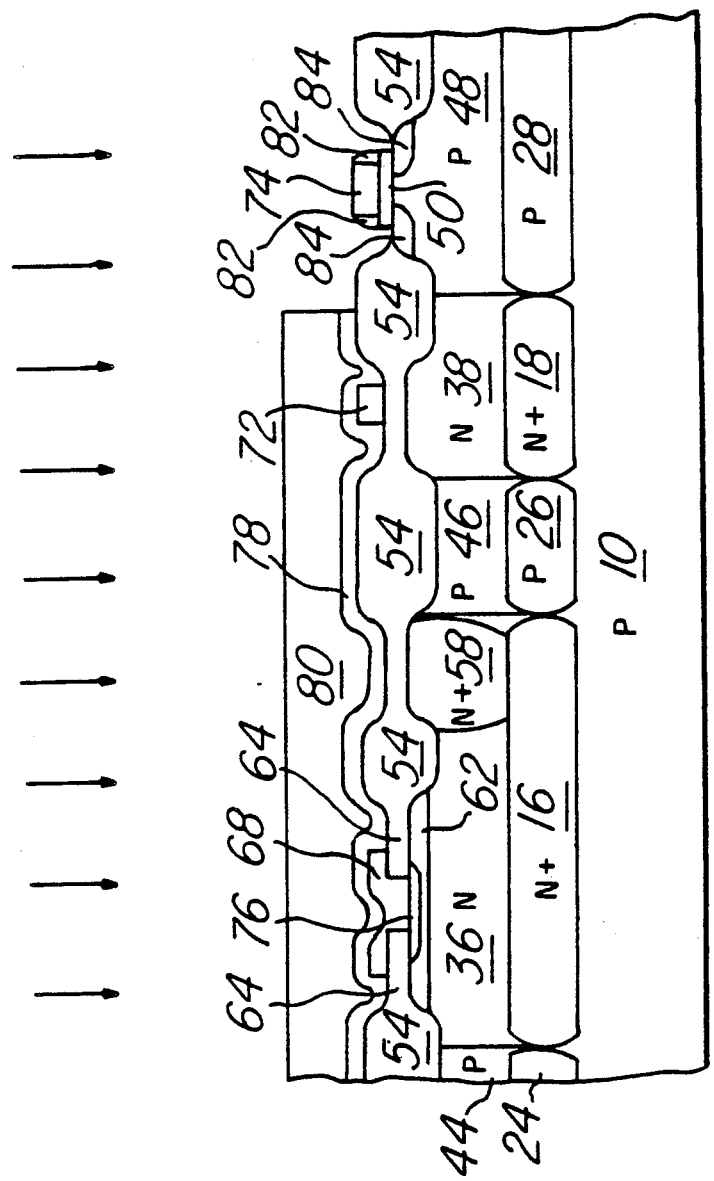

A layer of silicon dioxide 78 is then formed on the surface of the structure of FIG. 12A, as shown in FIG. 13A. A suitable etching mask 80 is then formed on the surface of silicon dioxide layer 78 as shown in FIG. 18A. Etch mask 80 and silicon dioxide layer 78 are patterned and etched to expose the surface of P well 48 which is not covered by gate 74. The removal of etch mask 80 and silicon dioxide layer 78 is conducted by anisotropic etching using reactive ion etching. Thus, a portion of silicon dioxide layer 78 will remain as sidewall oxide layers 82. An ion implantation of arsenic is then performed having an energy of 150 Kiloelectron-Volts and a density of approximately $3 \times 10^{15}$ ions/cm$^2$. This ion implantation is then annealed to form source/drain regions 84, as shown in FIG. 14A.

Etch mask 80 is then removed and a second etch mask 86 is formed as shown in FIG. 15A. Etch mask 86 is then patterned using common photolithographic techniques to provide the structure for etch mask 86 as shown in FIG. 15A. Etch mask 86 is then used to etch silicon dioxide layer 78 and silicon dioxide layers 50 and 64 to expose the surfaces of N wells 36 and 38 where not covered by the structure of base contact 68 and gate 72. The structure of FIG. 15A is then subjected to an ion implantation of boron ions having an energy of approximately 20 Kiloelectron-Volts and a density of approximately $3 \times 10^{15}$ ions/cm$^2$. This forms P+ source drain regions 90 and base contact regions 92 as shown in FIG. 15A. In addition, because the etching of silicon dioxide layer 78 is performed using an anisotropic process, sidewall oxide regions 88 remain on the sides of base contact 68 and gate 72.

Thus are fabricated NPN transistor 94, P channel transistor 96 and N channel transistor 98. Additional steps such as silicidation of the surfaces of base contact 68, gates 72 and 74, source drain regions 84, source drain regions 90, and base contact regions 92 may be performed to provide better conductivity for the resulting structure.

Figure 15B:
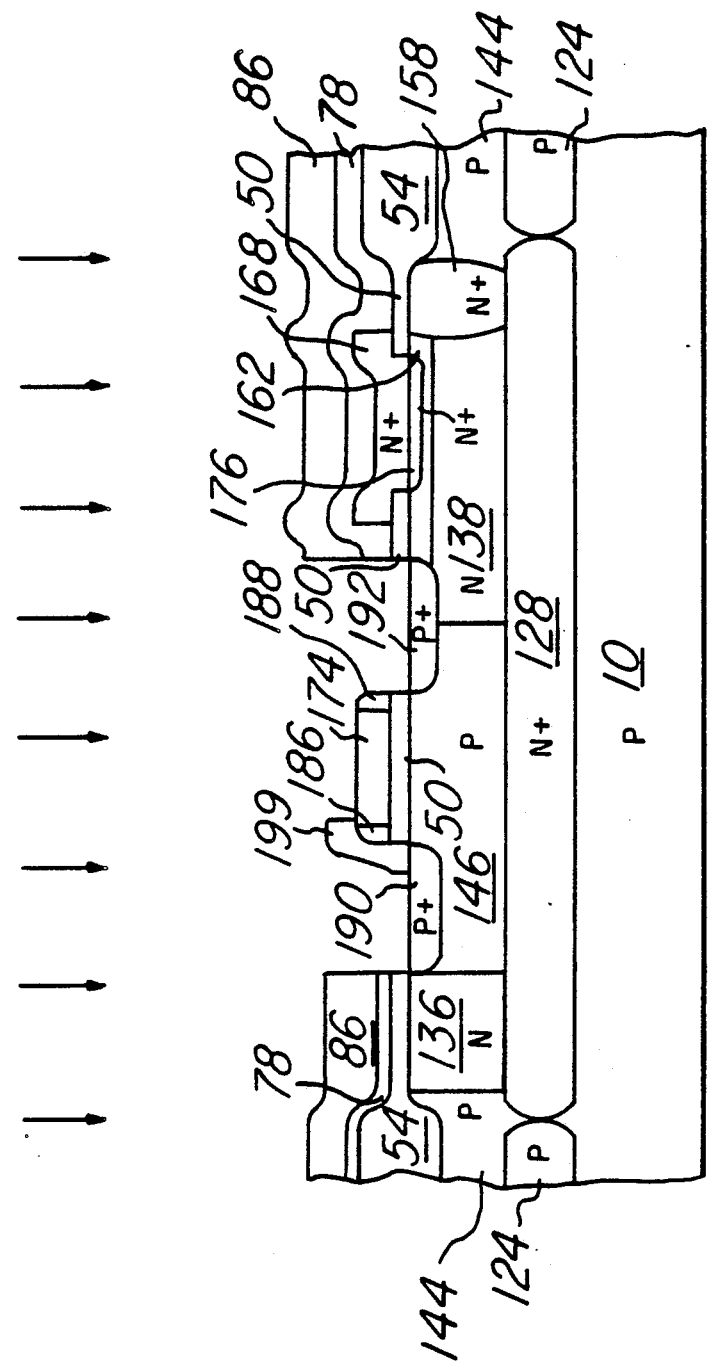
Figure 16:
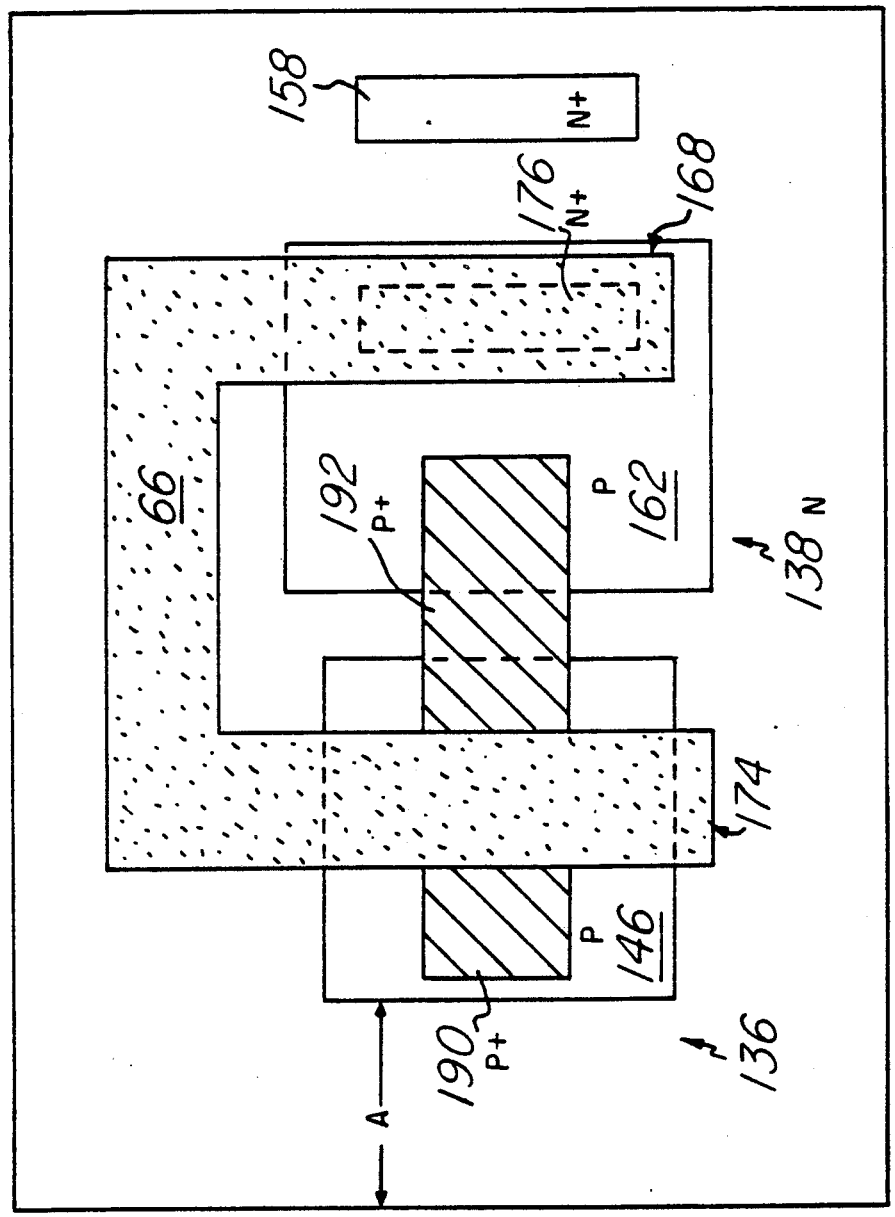
FIG. 16 is a plan view diagram of the embodiment of the present invention fabricated using the processes shown in FIGS. 4B, 7B, 9B through 12B and 15B.

Photoresist layer 86 and silicon dioxide layer 78 are also patterned as shown in FIG. 15B. The anisotropic etching of silicon dioxide layer 78 provides silicon dioxide sidewall layers 188, as shown in FIG. 15B. The same ion implantation source/drain regions 90 in FIG. 15A is also used to form source/drain regions 190 and 192 in FIG. 15B. The combination of P+ source/drain regions 190 and 192 and gate 174 provides a resistive element that behaves in effect as a depletion mode field effect transistor. Source region 192 is automatically connected to base region 162 because of its location. Thus, source region 192 provides one end of the resistive load device. Gate 174 is connected emitter contact 168 by proper patterning of polycrystalline silicon layer 66 as shown in the plan view shown in FIG. 16. Drain region 190 is then connected using normal metallization techniques or by providing a local interconnect 199 as shown in FIG. 15B. Local interconnect 199 is formed using, for example, the techniques shown in U.S. Pat. No. 4,821,085, issued Apr. 11, 1989 to Haken, et al., and assigned to the assignee of this application, and which is hereby incorporated by reference.

FIG. 16 is a plan view diagram of the integral load bipolar transistor structure which is one embodiment of the present invention and which is fabricated as shown the FIGS. 4B, 7B, 9B through 12B and FIG. 15B. As can be seen from FIG. 16, gate 174 is connected to emitter contact 168 by patterning of polycrystalline silicon layer 66. N well 138 and 136 are formed contiguously to completely isolate P well 148 laterally and N+ region 128 (FIG. 15B) isolates P well 146 vertically. In practice, collector contact 158 is spaced away from P region 162, as shown in FIG. 16. This prevents a leakage mechanism from occurring between N+ region 158 and base 162.

In another embodiment of the present invention, N well region 136 is eliminated and P well 146 is allowed to be in contact with P substrate 10. Because emitter 176 is often connected to ground potential in integrated circuitry, isolation between the ground potential connected to P+ drain 190 and grounded P substrate 10 is unnecessary. Therefore, the region as labeled A in FIG. 16 may be eliminated and an even more compact structure may be realized.

Although specific embodiments of the present invention are disclosed herein, they are not to be construed as limiting the scope of the present invention. For example, other methods of fabrication using different processing methods, such as that shown in copending U.S. application Ser. No. 129,261, which is assigned to the assignee of the present application and which is hereby incorporated by reference, may be modified and used within the overall method of the invention. Other embodiments of the present invention will become clear to those skilled in the art in light of the teachings of the specification. The scope of the invention is limited only by the claims appended hereto.

What is claimed is:

1. A method for forming a device in an integrated circuit, comprising the steps of:
    forming a collector region in a substrate, said collector region having a first conductivity type;
    forming a base region in said substrate adjacent to said collector region, said base region having a second conductivity type;
    forming a drain region in said substrate having said second conductivity type, said drain region being separated from said base region by a channel region;
    forming a gate adjacent to said channel region said gate controlling the conductivity of said channel region between said base and said drain;
    forming an emitter region in said substrate adjacent to said base region, said emitter region having said first conductivity type; and
    forming an electrical connection between said emitter region and said gate.

2. The method of claim 1 wherein said substrate comprises crystalline silicon.

3. The method of claim 1 further the step of forming a gate insulator between said gate and said channel region.

4. The method of claim 1 and further comprising the step of forming a well region in said substrate, said channel region, said drain region and at least a portion of said base region being formed in said well region, said well region being electrically isolated from other components formed in said substrate outside of said well.

5. The method of claim 4 wherein said well has the same conductivity type as said drain region and said base region.

6. The method of claim 1 wherein said drain region, said channel region and said base region comprise the same conductivity type.

* * * * *